(12) United States Patent
Mori (10) Patent No.: US 7,569,819 B2
(45) Date of Patent: Aug. 4, 2009

(54) ELECTRON BEAM SYSTEM AND METHOD OF OPERATING THE SAME

(75) Inventor: Norihisa Mori, Tokyo (JP)

(73) Assignee: JEOL Ltd., Tokyo (JP)

( * ) Notice: Subject to any disclaimer, the term of this patent is extended or adjusted under 35 U.S.C. 154(b) by 173 days.

(21) Appl. No.: 11/873,639

(22) Filed: Oct. 17, 2007

(65) Prior Publication Data

US 2008/0087821 A1    Apr. 17, 2008

(30) Foreign Application Priority Data

Oct. 17, 2006   (JP)   ............... 2006-282212
May 25, 2007   (JP)   ............... 2007-138679

(51) Int. Cl.
*H01J 37/26*   (2006.01)
(52) U.S. Cl. .................................... 250/310
(58) Field of Classification Search .................. 250/310
See application file for complete search history.

(56) References Cited

U.S. PATENT DOCUMENTS 5,717,204 A * 2/1998 Meisburger et al. ......... 250/310

FOREIGN PATENT DOCUMENTS

| JP | 52-117192 | 10/1977 |
|---|---|---|
| JP | 08-148111 | 6/1996 |
| JP | 08-201317 | 8/1996 |
| JP | 2000-036276 | 2/2000 |

* cited by examiner

*Primary Examiner*—Kiet T Nguyen
(74) *Attorney, Agent, or Firm*—The Webb Law Firm (57) ABSTRACT

An electron beam system (such as a scanning electron microscope or an electron probe microanalyzer) capable of displaying backscattered electron (BSE) images at the same brightness and same contrast at all times if the atomic number differences are the same when illumination conditions including accelerating voltage and emission current are varied or when the specimens are imaged with different instruments.

10 Claims, 10 Drawing Sheets

A BACKSCATTEREED ELECTRON IMAGE
UNDER LOW-CONTRAST CONDITIONS

A BACKSCATTEREED ELECTRON IMAGE
UNDER HIGH-CONTRAST CONDITIONS

ELECTRON BEAM SYSTEM AND METHOD OF OPERATING THE SAME

BACKGROUND OF THE INVENTION

1. Field of the Invention

The present invention relates to an electron beam system (such as an electron probe microanalyzer (EPMA)) or a scanning electron microscope (SEM) for directing a sharply focused electron beam at the surface of a specimen and gaining a backscattered electron image using electrons backscattered from the specimen to thereby permit the user to make an observation or analysis). More specifically, the invention relates to an electron beam system for gaining and displaying backscattered electron images having appropriate brightness and contrast and to a method of operating the system.

2. Description of Related Art

It is known that the intensity of electrons (known as backscattered electrons or reflected electrons) backscattered from a specimen irradiated with an electron beam is dependent on the average atomic number of the specimen. However, where the specimen surface is tilted, the direction in which the intensity of the backscattered electrons maximizes is substantially symmetrical with respect to the line normal to the specimen surface. Therefore, the intensity of backscattered electrons incident on a detector disposed only on one side of the tilted surface is greatly affected by the orientation of the tilted surface. Consequently, in practice, many instruments are equipped with backscattered electron imaging (BSEI) capabilities capable of separating information about the composition (average atomic number) from topographic information indicating the tilt of the surface.

Figure 9A:
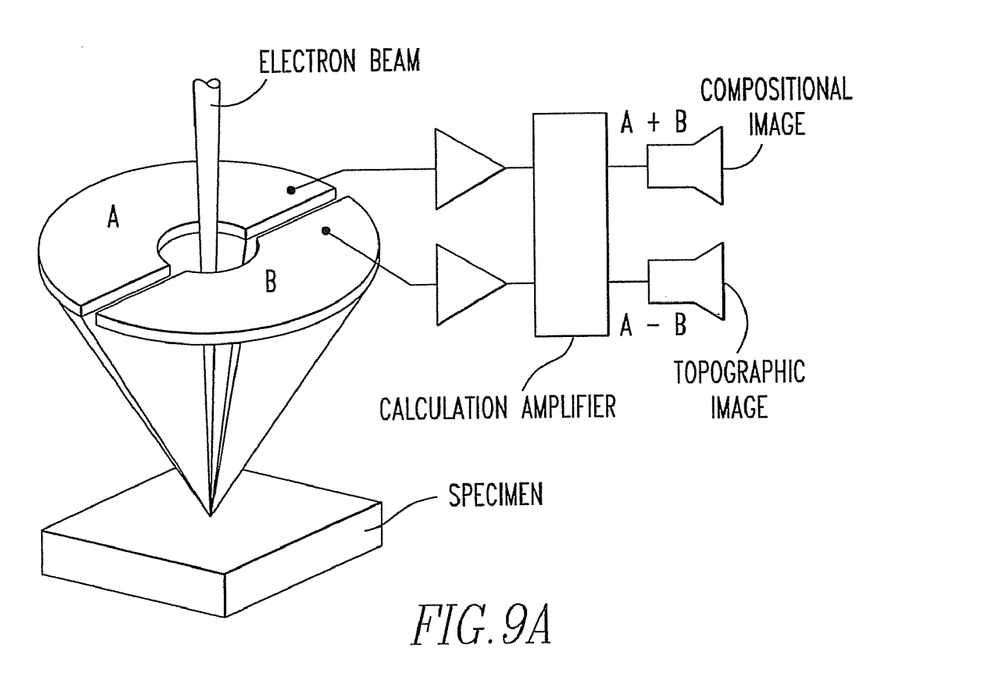
FIGS. 9A and 9B illustrate the principle of a method of separating compositional information carried by a backscattered electron signal from topographic information.
Figure 9B:
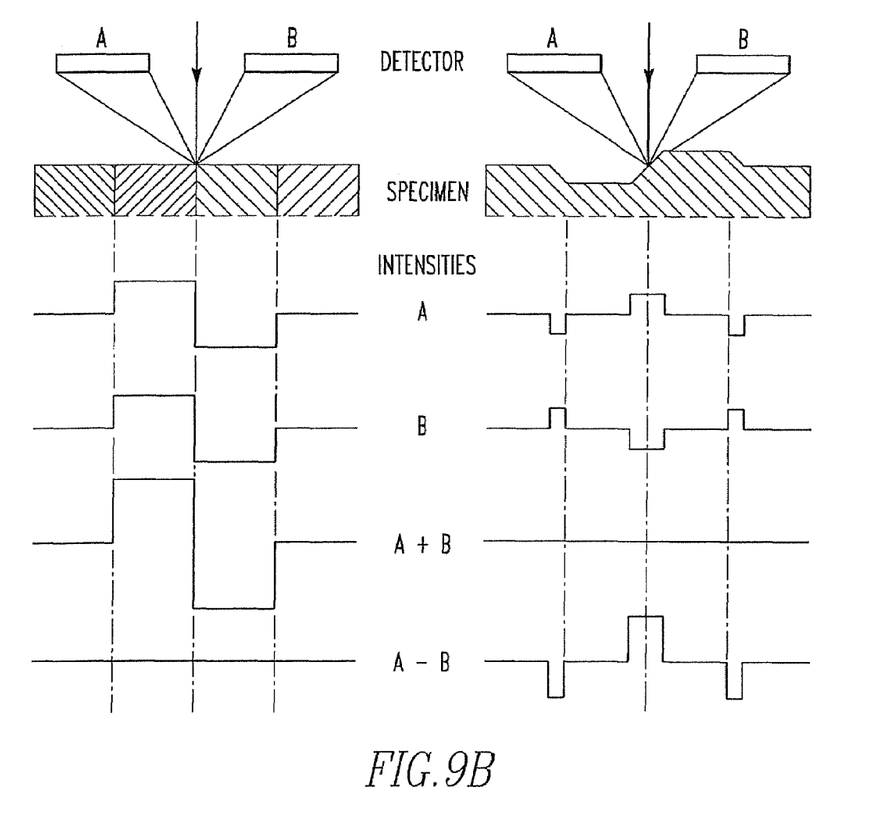

FIGS. 9A and 9B illustrate the principle of a method of separating compositional information from the topographic information by this kind of backscattered electron imaging device. A backscattered electron detector assembly shown in FIG. 9A consists of a pair of detectors A and B having the same detection sensitivity. The detectors A and B are arranged symmetrically with respect to an electron beam directed at the specimen. As shown in FIG. 9B, if the sum (A+B) of the output signals from the detectors A and B is taken, information about the surface tilt is canceled out, while the compositional information is emphasized. Conversely, if the difference (A−B) is taken, the compositional information is canceled out, whereas the topographic information is emphasized. An image created from the sum signal (A+B) is known as a compositional BSE (backscattered electron) image or simply as a compositional image. An image created from the differential signal (A−B) is known as a topographic BSE image or simply as a topographic image. The relationship between the intensity of backscattered electron signal and the average atomic number is discussed on the assumption that the specimen is flat and smooth or that the sum output signal (A+B) shown in FIGS. 9A and 9B is utilized.

Figure 10:
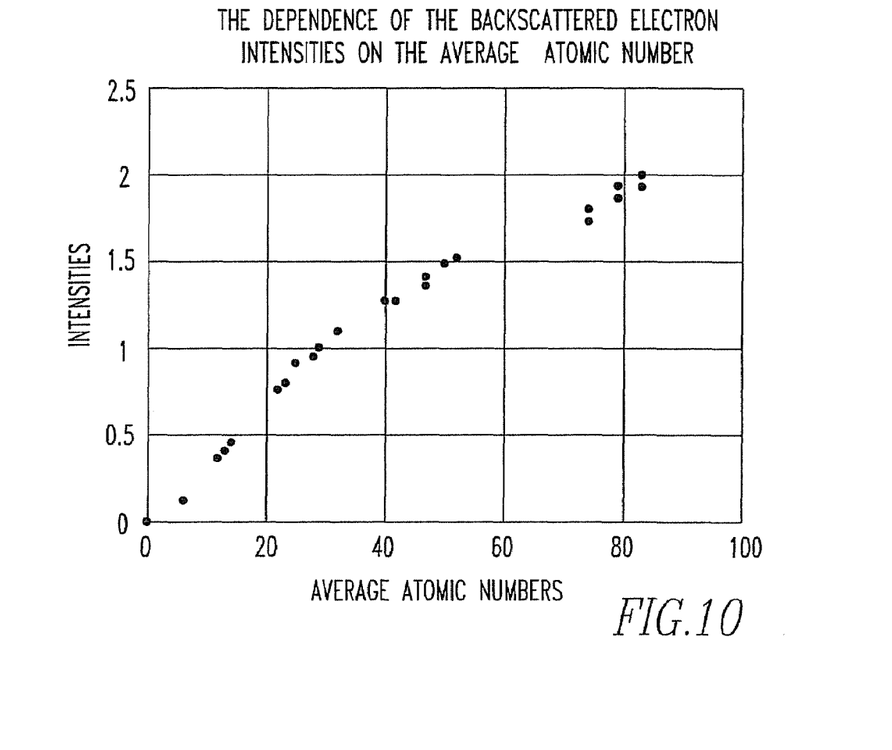
FIG. 10 is a graph showing the dependence of the intensities of backscattered electron signals on average atomic number.

FIG. 10 is a graph of data obtained by measurements of signal intensities from a backscattered electron detector for the average atomic numbers of specimens under some different accelerating voltages. The horizontal axis indicates average atomic numbers. The vertical axis indicates the intensities of the backscattered electron signals. The signal intensities have been normalized based on a backscattered electron signal intensity obtained from copper having an average atomic number of 29. It can be seen that as the average atomic number is increased, the backscattered electron intensity increases monotonously. The dependence of the backscattered electron intensity on the atomic number is not linear in practice but, strictly speaking, has somewhat complex relationships because of a varying term of the minimum excitation voltage. However, within a limited range of atomic number differences, linear approximation is available in practical applications.

The dependence of backscattered electron intensity on atomic number is used in various kinds of analysis. For example, in Japanese Patent Laid-Open No. S52-117192, there is disclosed a technique of identifying the properties of carbons and cokes by making use of the relationships of backscattered electron intensity to hydrogen and carbon contents of coals and cokes. In Japanese Patent Laid-Open No. H8-201317, there is disclosed a technique of identifying compounds contained in a metal specimen by previously preparing a calibration curve from the relationship between a reference specimen having a known atomic number and the backscattered electron intensity and identifying the compounds from actually measured intensities of backscattered electrons. In Japanese Patent Laid-Open No. H8-148111, there is disclosed a technique of automatically searching for foreign matter on a bare wafer by utilizing compositional contrast given by backscattered electrons.

Since backscattered electron signals well reflect compositional information about specimens as described previously, backscattered electron signals are widely used in surface imaging and analysis instruments including SEM and EPMA, together with secondary electron signals. For example, in Japanese Patent Laid-Open No. 2000-36276, there is disclosed a technique of dispensing with readjustment of contrast and brightness when imaging is done by a computer-controlled electron microscope and when the imaging is done while switching the mode of operation between secondary electron imaging mode and backscattered electron imaging mode.

Where imaging and analysis are performed by SEM or EPMA, it is customary to greatly vary the illumination conditions including accelerating voltage and emission current depending on the state of the specimen and on the purpose of imaging or analysis. When a portion having a different composition, such as inclusions present on the specimen, should be discerned, the brightness and contrast of the backscattered electron image are appropriately adjusted to display an image that is easy to view.

Figure 11A:
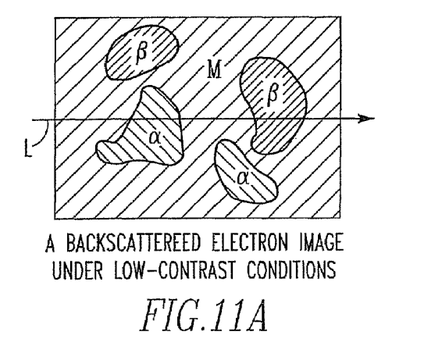
FIGS. 11A, 11B, 11C and 11D show conceptual diagrams illustrating the relationships among the brightness of a backscattered electron image, contrast, and the intensity of the backscattered electron signal.
Figure 11B:
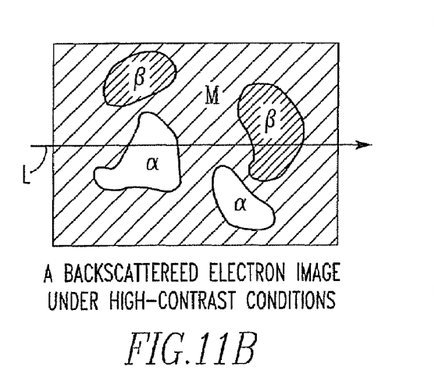
Figure 11C:
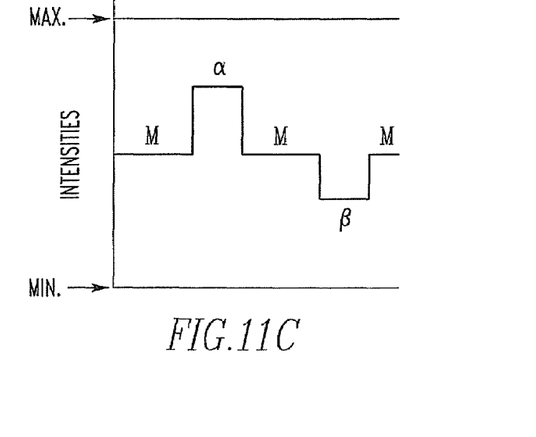
Figure 11D:
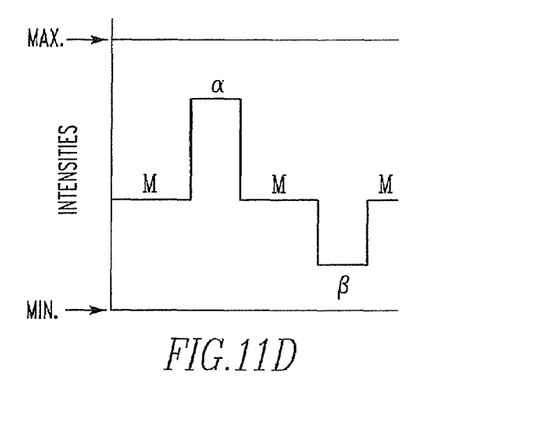

FIGS. 11A and 11B conceptually illustrate the relationships among the brightness of a backscattered electron image, contrast, and the intensity of a backscattered electron signal. Shown in FIG. 11A is a backscattered electron image of a field of view under low-contrast conditions. Shown in FIG. 11B is a backscattered electron image of the same field of view under high-contrast conditions. A specimen has three phases $\alpha$, $\beta$, and M which have their respective average atomic numbers determined by their compositions. An electron beam was scanned over a straight line L. Variations in the intensity of the backscattered electron signal produced at this time are shown in the graphs in FIGS. 11C and 11D. Contrast of a backscattered electron image varies if the illumination conditions including accelerating voltage and emission current are varied or the amplification factor of the amplifier is varied. Furthermore, if the sensitivity of the backscattered electron detector is varied due to contamination, the contrast is varied. If the amplification factor of the amplifier is changed, the DC component of the signal is also varied. Therefore, the brightness is normally adjusted by varying the offset of the amplifier.

However, where specimens of similar kinds, such as different portions of the same specimen, are imaged under various illumination conditions, the user may want to display a backscattered electron image such that portions of the same composition are displayed at the same brightness and contrast. In this case, there is the problem that it is laborious to calibrate the sensitivity of the backscattered electron detector using a reference specimen.

Where a different instrument is used, the sensitivity of the backscattered electron detector equipped to the instrument and the amplification factor of the amplifier are different from those of the previous instrument. Therefore, when the user attempts to compare backscattered electron images of the same specimen, there is no reference against which the measurement can be compared. Consequently, there is the problem that accurate comparisons cannot be made.

In the case of the technique disclosed in Japanese Patent Laid-Open No. S52-117192 or the technique disclosed in Japanese Patent Laid-Open No. H8-201317, it is necessary to strictly maintain constant the relationship (calibration curve) between the intensity of backscattered electrons and the average atomic number of the specimen. Therefore, there is the problem that the same illumination conditions including the accele rating voltage of the electron beam directed at the specimen and emission current must be used at all times or, if the conditions are varied, the calibration curve must be measured again.

SUMMARY OF THE INVENTION

It is an object of the present invention to provide a technique of displaying a backscattered electron image at the same brightness and at the same contrast at all times if the atomic number difference is the same (i) when illumination conditions including accelerating voltage and emission current are varied or (ii) when a specimen is imaged with a different instrument or (iii) when both conditions (i) and (ii) take place at the same time.

A first embodiment of the present invention which solves the foregoing problems provides an electron beam system having a function of obtaining a backscattered electron image by directing a sharply focused electron beam at a surface of a specimen and detecting backscattered electrons emanating from the specimen. The electron beam system comprises: accelerating voltage-setting circuit for setting an accelerating voltage of the electron beam; emission current-measuring detector for measuring an emission current of the electron beam; signal intensity-measuring circuit for measuring intensity of an output signal from an amplifier that amplifies the output signal from a backscattered electron detector; amplification factor-adjusting circuit for adjusting amplification factor of the amplifier such that contrast of the backscattered electron image is varied by increasing or reducing intensity of the output signal from the backscattered electron detector; offset-adjusting circuit for adjusting the offset of the amplifier such that brightness of the backscattered electron image is varied by increasing or reducing a DC component of the output signal from the amplifier; storage device for storing the intensity of the output signal from the amplifier, amplification factor, and offset when the intensity of a backscattered electron signal was measured under conditions including at least one of a reference accelerating voltage and a reference emission current and using a reference specimen having a known average atomic number; and calculational unit for finding an amplification factor and an offset of the amplifier to make a correction such that the amplifier produces a signal intensity equal to the intensity of the backscattered electron signal produced under the conditions including at least one of the reference accelerating voltage and the reference emission current when at least one of accelerating voltage and emission current that has been set is varied from the reference accelerating voltage and/or the reference emission current.

When the backscattered electron image is obtained under conditions including at least one of an arbitrary accelerating voltage and an arbitrary emission current, the calculational unit finds an amplification factor and an offset of the amplifier at which the amplifier produces an intensity equal to the intensity of the backscattered electron signal obtained under the conditions including at least one of the reference accelerating voltage and the reference emission current, based on the intensity of the output signal from the amplifier, amplification factor, and offset obtained when the intensity of the backscattered electron signal was measured under the conditions including at least one of the reference accelerating voltage and the reference emission current stored in the storage device. The amplification factor-adjusting circuit and the offset-adjusting circuit adjust the amplification factor and the offset of the amplifier, respectively, such that the found amplification factor and offset are achieved.

A second embodiment of the present invention is based on the first embodiment and further characterized in that the calculational unit finds an amplification factor and an offset of the amplifier at which the amplifier produces an intensity equal to the intensity of the backscattered electron signal obtained under the conditions including at least one of the reference accelerating voltage and the reference emission current on the assumption that there is a linear relationship between an amount of variation of the intensity of the output signal from the amplifier and an amount of variation of at least one of the accelerating voltage and emission current.

A third embodiment of the present invention is based on the first or second embodiment and further includes specifying device for specifying a desired range of average atomic numbers when a backscattered electron image is obtained under conditions including at least one of an arbitrary accelerating voltage and an arbitrary emission current. The calculational unit finds an amplification factor and an offset of the amplifier at which intensities of the backscattered electron signal corresponding to upper and lower limits, respectively, of the range of average atomic numbers specified by the specifying unit are equal to the upper and lower limits of the intensity of the output signal from the amplifier. The amplification factor-adjusting circuit and the offset-adjusting circuit adjust the amplification factor and offset of the amplifier such that the found amplification factor and offset are achieved.

A fourth embodiment of the present invention is based on the third embodiment and further characterized in that when the amplification factor and offset of the amplifier at which the upper and lower limits of the intensity of the backscattered electron signal corresponding to the range of average atomic numbers specified by the specifying unit become equal to the upper and lower limits of the intensity of the output signal from the amplifier, the calculational unit finds the amplification factor and offset of the amplifier at which the upper and lower limits of the intensity of the backscattered electron signal become equal to the upper and lower limits of the intensity of the output signal from the amplifier, based on a previously found relational formula about average atomic numbers and the intensity of the output signal from the amplifier and on an intensity of the output signal from the amplifier, an amplification factor, and an offset obtained when the intensity of the backscattered electron signal was measured under the conditions including at least one of the reference accelerating voltage and the reference emission current stored in the storage device.

A fifth embodiment of the present invention is based on the third or fourth embodiment and further characterized in that the backscattered electron image displayed using signal intensities in a range delineated by the upper and lower limits of the range of the intensity of the output signal from the amplifier which corresponds to the range of average atomic numbers specified by the specifying unit is classified into plural levels using arbitrary intensities. The backscattered electron image is displayed in real time together with a color bar having colors respectively assigned to the levels of the image.

A sixth embodiment of the present invention provides a method of operating an electron beam system having a function of obtaining a backscattered electron image by directing a sharply focused electron beam at a surface of a specimen and detecting backscattered electrons emanating from the specimen. The electron beam system comprises: accelerating voltage-setting circuit for setting an accelerating voltage of the electron beam; emission current-measuring detector for measuring an emission current of the electron beam; signal intensity-measuring circuit for measuring intensity of an output signal from an amplifier that amplifies an output signal from a backscattered electron detector; amplification factor-adjusting circuit for adjusting the amplification factor of the amplifier such that contrast of the backscattered electron image is varied by increasing or reducing the intensity of the output signal from the amplifier; offset-adjusting circuit for adjusting the offset of the amplifier such that brightness of the backscattered electron image is varied by increasing or reducing a DC component of the output signal from the amplifier; storage device for storing the intensity of the output signal from the amplifier, amplification factor, and offset when the intensity of a backscattered electron signal was measured under conditions including at least one of a reference accelerating voltage and a reference emission current and using a reference specimen having a known average atomic number; and calculational unit for finding the amplification factor and offset of the amplifier to make a correction such that the amplifier produces a signal intensity equal to the intensity of the backscattered electron signal produced under the conditions including at least one of the reference accelerating voltage and the reference emission current when at least one of accelerating voltage and emission current that has been set is varied from the reference accelerating voltage and/or the reference emission current.

When the backscattered electron image is obtained under conditions including at least one of an arbitrary accelerating voltage and an arbitrary emission current, the calculational unit finds an amplification factor and an offset of the amplifier at which the amplifier produces an intensity equal to the intensity of the backscattered electron signal obtained under the conditions including at least one of the reference accelerating voltage and the reference emission current, based on the intensity of the output signal from the amplifier, amplification factor, and offset obtained when the intensity of the backscattered electron signal was measured under the conditions including at least one of the reference accelerating voltage and the reference emission current stored in the storage device. The amplification factor-adjusting means and the offset-adjusting means adjust the amplification factor and the offset of the amplifier, respectively, such that the found amplification factor and offset are achieved.

A seventh embodiment of the present invention is based on the sixth embodiment and further characterized in that the calculational unit finds an amplification factor and an offset of the amplifier at which the amplifier produces an intensity equal to the intensity of the backscattered electron signal obtained under conditions including at least one of the reference accelerating voltage and the reference emission current on the assumption that there is a linear relationship between an amount of variation of the intensity of the output signal from the amplifier and an amount of variation of at least one of the accelerating voltage and emission current.

An eighth embodiment of the present invention is based on the sixth or seventh embodiment and further characterized in that the calculational unit finds an amplification factor and an offset of the amplifier at which intensities of the backscattered electron signal corresponding to upper and lower limits, respectively, of a specified range of average atomic numbers are equal to the upper and lower limits of the intensity of the output signal from the amplifier. The amplification factor-adjusting means and the offset-adjusting means adjust the amplification factor and offset of the amplifier such that the found amplification factor and offset are achieved.

A ninth embodiment of the present invention is based on the eighth embodiment of the present invention and further characterized in that when the amplification factor and offset of the amplifier at which the upper and lower limits of the intensity of the backscattered electron signal corresponding to the specified range of average atomic numbers are equal to the upper and lower limits of the intensity of the output signal from the amplifier are found, the calculational unit finds the amplification factor and offset of the amplifier at which signal intensities equal to the upper and lower limits are produced, based on a previously found relational formula about average atomic numbers and the intensity of the output signal from the amplifier and on an intensity of the output signal from the amplifier, an amplification factor, and an offset obtained when the intensity of the backscattered electron signal was measured under the conditions including at least one of the reference accelerating voltage and the reference emission current stored in the storage device.

A tenth embodiment of the present invention is based on the eighth or ninth embodiment and further characterized in that the backscattered electron image displayed using signal intensities in a range delineated by the upper and lower limits of the range of the intensity of the output signal from the amplifier which corresponds to the specified range of average atomic numbers is classified into plural levels using arbitrary intensities. The backscattered electron image is displayed in real time together with a color bar having colors respectively assigned to the levels of the image.

According to the first or sixth embodiment of the present invention, if the illumination conditions including accelerating voltage and emission current vary or if a different instrument is used, backscattered electron images of fields of view can be displayed at the same contrast and the same brightness as long as the fields of view have the same average atomic number difference. Consequently, backscattered electron images of the same specimen or of similar kinds of specimens either obtained under different illumination conditions or displayed with different instruments can be quantitatively compared.

According to the second or seventh embodiment of the present invention, when the relationship between intensity of backscattered electrons and average atomic number of the specimen is calibrated against a different accelerating voltage, it suffices to use only one reference specimen. Consequently, the calibration can be carried out easily.

According to the third or eighth embodiment of the present invention, in a backscattered electron image displayed in a desired range of average atomic numbers, the position corresponding to the upper limit of average atomic numbers is fixed at the brightest state. The position corresponding to the lower limit is fixed at the darkest state. Images are displayed at the same contrast and same brightness at all times. Consequently, backscattered electron images of the same specimen or of similar kinds of specimens either obtained under different illumination conditions or displayed with different instruments can be quantitatively compared.

According to the fourth or ninth embodiment of the present invention, the relationship between the average atomic number and the intensity of the output signal from the amplifier is previously found. Backscattered electron images of the same specimen or of similar kinds of specimens either obtained under different illumination conditions or displayed with different instruments can be quantitatively compared while the backscattered electron images are displayed in real time.

According to the fifth or tenth embodiment of the present invention, a backscattered electron image using a different color for each different level of average atomic number is displayed in real time together with the color bar. Consequently, backscattered electron images of the same specimen or of similar kinds of specimens either obtained under different illumination conditions or displayed with different instruments can be quantitatively compared quickly. Also, the images are easy to view.

Other objects and features of the invention will appear in the course of the description thereof, which follows.

DESCRIPTION OF THE PREFERRED EMBODIMENTS

Embodiments of the present invention are hereinafter described with reference to the accompanying drawings. Like components are indicated by like reference numerals in various figures. Repeated detailed description will be avoided. In the description of the present invention, the intensity of a backscattered electron signal or a backscattered electron image indicates compositional information from which topographic information carried by backscattered electrons has been removed.

Figure 1:
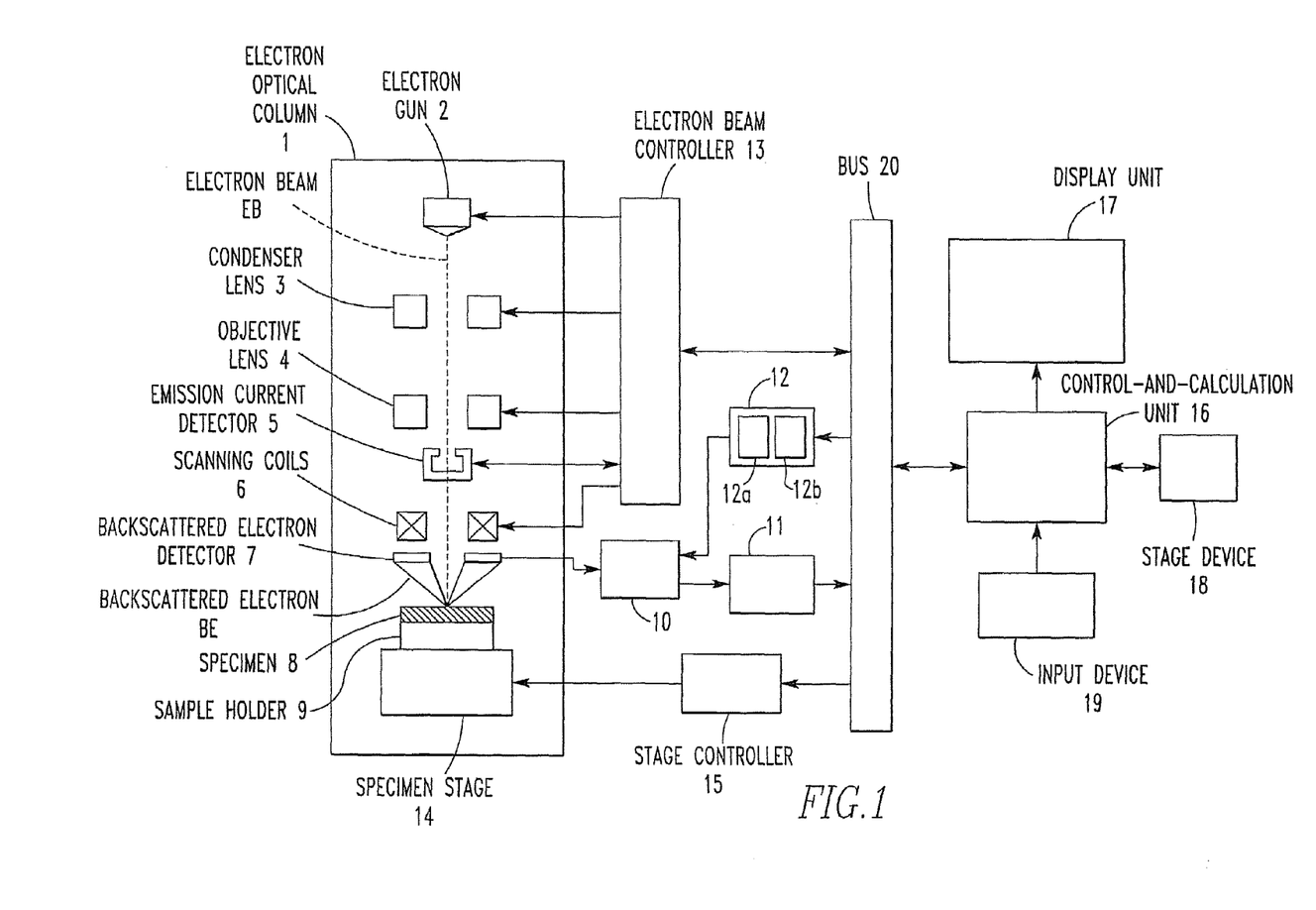
FIG. 1 is a schematic block diagram of an electron beam system embodying the present invention.

FIG. 1 schematically shows an example of the structure of an electron beam system embodying the present invention. In FIG. 1, the electron beam system has an electron optical column 1 whose inside is maintained in a vacuum by a vacuum-pumping system (not shown). The electron beam system further includes an electron gun 2 driven by an electron beam controller 13 including an accelerating voltage-setting circuit. The gun 2 emits an electron beam EB that is sharply focused onto a specimen 8 by a condenser lens 3 and an objective lens 4. The electron beam EB is scanned in two dimensions over the specimen 8 by a deflection action of scanning coils 6. As a result, backscattered electrons BE are produced from the specimen 8 and detected by a backscattered electron (BSE) detector 7. The output signal from the detector 7 responsive to the backscattered electrons BE is sent to a control-and-calculation unit (calculational means) 16 via an amplifier 10, an image processor 11 including a circuit for measuring the signal intensity, and a bus 20. The signal is displayed on a display unit 17 as a backscattered electron image synchronized to the scanning made by the scanning coils 6. An amplifier controller 12 including an amplification factor-adjusting circuit 12a and an offset-adjusting circuit 12b controls and adjusts settings of the amplification factor and offset of the amplifier 10 under instructions from the control-and-calculation unit 16. A specimen stage 14 on which a specimen holder 9 is placed is driven by a stage controller 15 to permit the beam position on the specimen 8 to be varied. The specimen 8 is held to the specimen holder 9.

An emission current detector 5 constituting an emission current-measuring detector is supported such that the detector can be inserted into and withdrawn from the passage for the electron beam EB. When the value of the emission current of the electron beam EB is measured, the detector 5 is inserted into the passage. The electron gun 2, condenser lens 3, objective lens 4, emission current detector 5, and scanning coils 6 are controlled by the control-and-calculation unit 16 via the bus 20 and electron beam controller 13. Parameters and data about calibration curves necessary for implementation of the present invention are stored in a storage device 18 constituting a storage means. An input device 19 consists of a computer mouse or a keyboard and constitutes a specifying unit.

Figure 2:
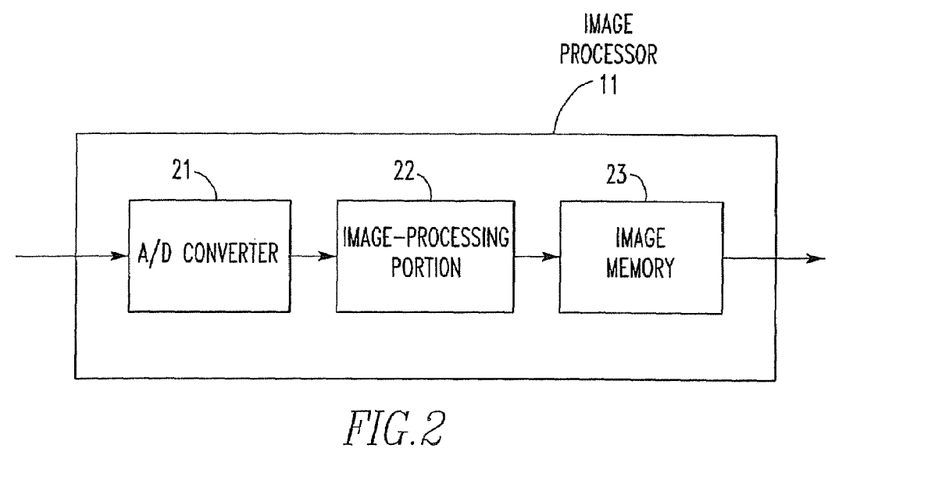
FIG. 2 is a schematic block diagram of an image-processing portion included in the electron beam system shown in FIG. 1.

Referring also to FIG. 2, an A/D converter 21 for performing analog-to-digital conversion of the backscattered electron signal, an image-processing portion 22 for performing processing, such as accumulation of frames, and an image memory 23 for storing data used to display the backscattered electron image are built in the image processor 11. The analog output from the amplifier 10 is converted into digital form by the A/D converter 21. In the present invention, the intensity of the backscattered electron signal from the amplifier 10 is measured by measuring the output from the A/D converter 21. The measurement is carried out within the image processor 11. The results of the measurement are sent to the control-and-calculation unit 16 from the image processor 11 via the bus 20.

In actual instrumentation, stigmator coils, image-moving coils, apertures, and other components are also disposed. Description of these components is omitted to describe the invention only briefly here.

Figure 3:
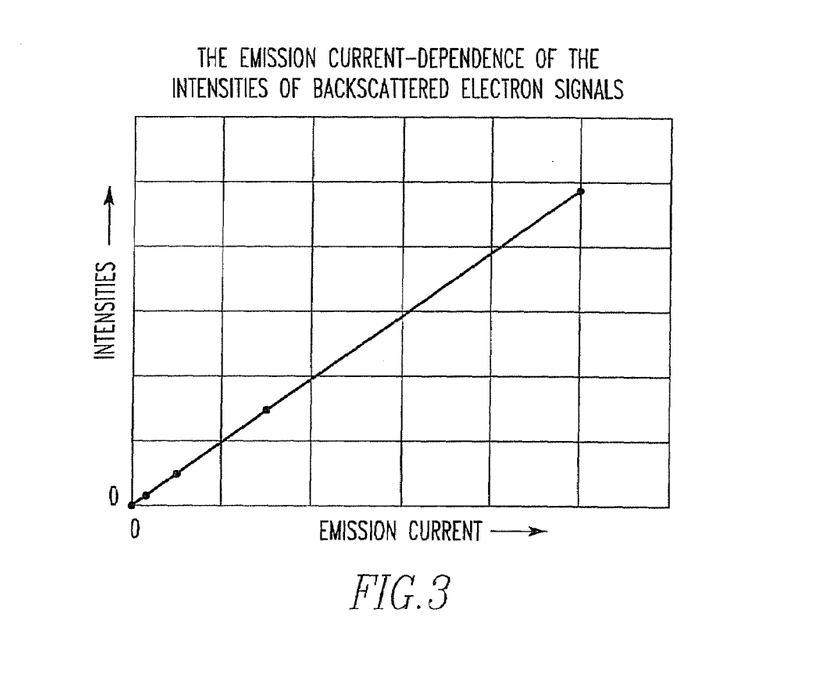
FIG. 3 is a graph showing the dependence of the intensity of a backscattered electron signal on emission current.

FIG. 3 is a graph showing the results of actual measurements of the emission current-dependence of the intensities of backscattered electron signals derived from some reference specimens having different atomic numbers. The value of the emission current is plotted on the horizontal axis on an arbitrary scale. The intensity of the backscattered electrons is plotted on the vertical axis on an arbitrary scale. In the graph, the atomic-number effects shown in FIG. 10 have been corrected. It can be seen that there is an almost proportional relationship between the intensity of the backscattered electron signal and the value of the emission current.

Figure 4:
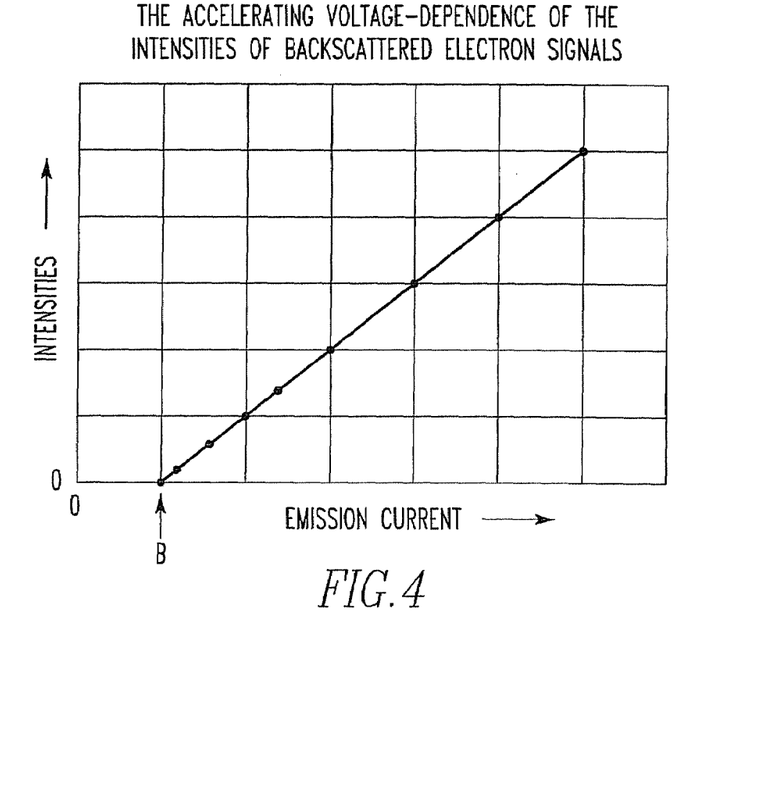
FIG. 4 is a graph showing the dependence of the intensity of a backscattered electron signal on accelerating voltage.

FIG. 4 is a graph showing the results of actual measurements of the accelerating voltage-dependence of the intensities of backscattered electron signals derived from some reference specimens having different atomic numbers. The accelerating voltage is plotted on the horizontal axis on an arbitrary scale. The intensity of each backscattered electron signal is plotted on the vertical axis on an arbitrary scale. The atomic-number effects shown in FIG. 10 have been corrected. It can be seen that there is an almost proportional relationship between the intensity of the backscattered electrons and the accelerating voltage. The straight line intersects the horizontal axis at a point B. The accelerating voltage at the point B is a constant whose value depends on the characteristics of the backscattered electron detector.

From the graphs of FIGS. 10, 3, and 4, the relationship between the intensity A $(Z_0, V_0, I_0)$ of the backscattered electron signal derived from a specimen having a reference average atomic number of $Z_0$ under conditions including an emission current of $I_0$ and an accelerating voltage of $V_0$ and the intensity A $(Z, V_1, I_1)$ of the backscattered electron signal derived from a specimen having an average atomic number of Z under conditions including a varied emission current of $I_1$ and a varied accelerating voltage of $V_1$ can be given by Eq. (1).

$$A(Z, V_1, I_1) = f(Z) \times A(Z_0, V_0, I_0) \times \frac{V_1 - B}{V_0 - B} \times \frac{I_1}{I_0} \quad (1)$$

where B is a constant term whose value depends on the characteristics of the backscattered electron detector and $f(Z)$ is a function expressing the relationship between the intensity of the backscattered electron signal in the graph of FIG. 10 and the average atomic number. When $Z=Z_0, f(Z)=1$.

If the average atomic number is lower than 29, $f(Z)$ can be approximated by a linear function. Where the atomic number of the actually measured specimen is close to the average atomic number of the reference specimen used for measurement of A $(Z_0, V_0, I_0)$, it can be expected that a good approximation will be made using a linear function. For example, if the average atomic number of the actually measured specimen is lower than 36, copper $(Z_0=29)$ can be used as a reference specimen. Similarly, where the average atomic number of the actually measured specimen is from 37 to 54, molybdenum $(Z_0=42)$ can be used as a reference specimen. Where the average atomic number is higher than 55, gold $(Z_0=79)$ may be used as a reference specimen. Where application to a wider range of average atomic numbers should be made, $f(Z)$ is approximated by a polynomial expression. In the present invention, no restrictions are imposed on the function used for $f(Z)$, because the function varies depending on the purpose of measurement.

Let $G_0$ be the gain of the amplifier when the intensity of the backscattered electron signal derived from a specimen having a reference average atomic number of $Z_0$ is A $(Z_0, V_0, I_0)$.

From the relationship given by Eq. (1), the gain $G_1$ of the amplifier necessary to obtain the same intensity of the backscattered electron signal as the intensity obtained from a specimen having the average atomic number of $Z_0$ under conditions including emission current $I_1$ and accelerating voltage $V_1$ is given by $$G_1 = G_0 \times \frac{V_0 - B}{V_1 - B} \times \frac{I_0}{I_1} \quad (2)$$

Figure 6:
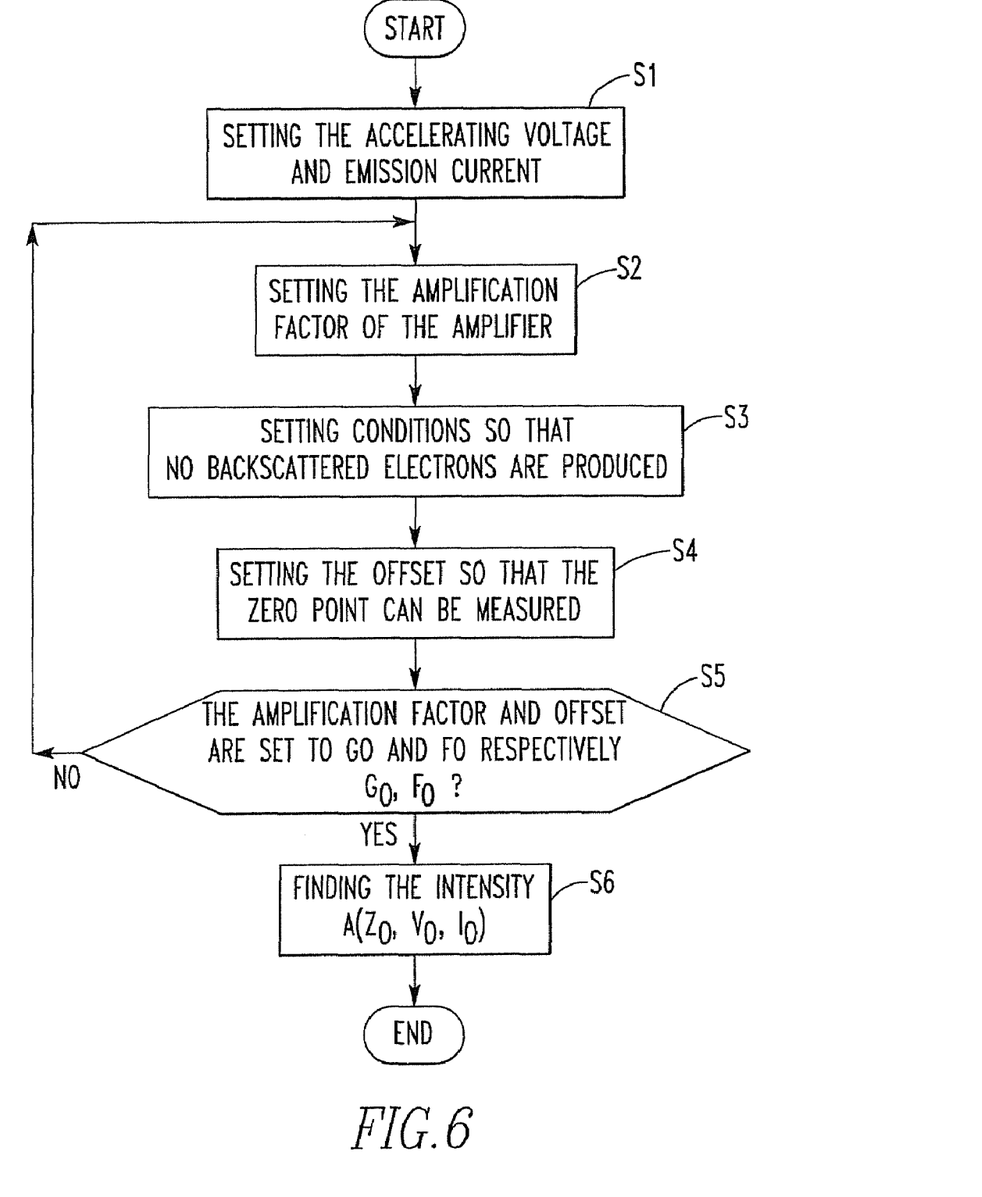
FIG. 6 is a flowchart illustrating a procedure for finding the intensity of a backscattered electron signal derived from a specimen having an average atomic number of $Z_0$.

A procedure for finding the intensity A $(Z_0, V_0, I_0)$ of the backscattered electron signal derived from the specimen having an average atomic number of $Z_0$ is described by referring to the flowchart of FIG. 6. A sequence of operations including operations performed by the operator is controlled by a program loaded in the control-and-calculation unit 16.

In step S1, the operator sets the accelerating voltage and the emission current to $V_0$ and $I_0$, respectively, as items of conditions under which the intensity A $(Z_0, V_0, I_0)$ of the backscattered electron signal derived from the reference specimen having the average atomic number of $Z_0$ is measured.

Figure 5:
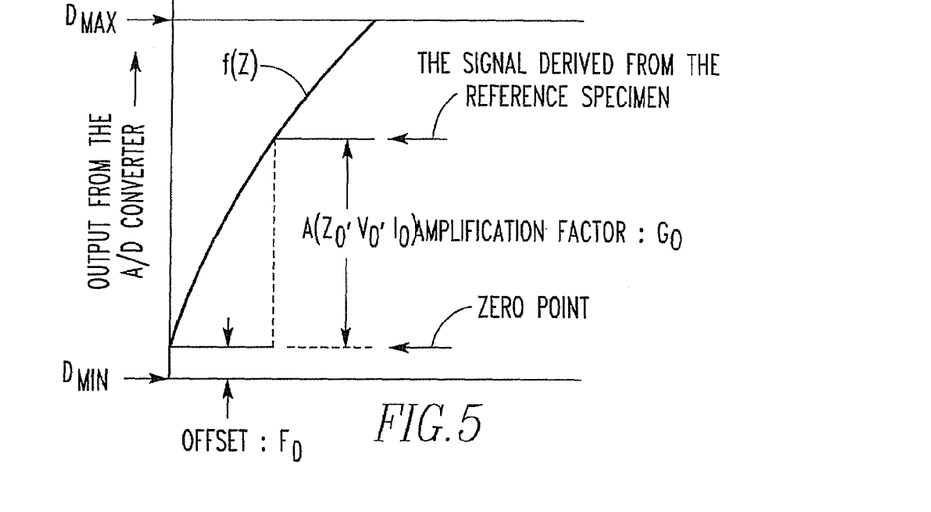
FIG. 5 is a graph illustrating a method of determining the intensity of a signal derived from a reference specimen and a zero point.

In step S2, the operator sets the amplification factor of the amplifier 10 to a value at which the intensity of the signal derived from the reference specimen can be measured. That is, as shown in FIG. 5, the intensity of the signal from the reference specimen is set to an appropriate level not exceeding $D_{MAX}$ of the output from the A/D converter.

In step S3, the operator sets the conditions under which no electron beam is directed at the specimen or the emission current or accelerating voltage is low enough that no backscattered electrons are produced from the reference specimen.

In step S4, the operator sets the offset of the amplifier 10 to a level at which the zero point of the intensity of the signal can be measured. FIG. 5 is a diagram illustrating a method of adjusting the amplification factor. The offset is adjusted such that the zero point of the intensity of the signal is at an appropriate level not lower than $D_{MIN}$ of the output from the A/D converter. The output from the A/D converter is often set to a range from about 8 bits to 16 bits though the range is different depending on the used instrument.

In step S5, if the two levels of the intensity of the signal derived from the reference specimen and the zero point are set to appropriate levels between $D_{MAX}$ and $D_{MIN}$ of the output from the A/D converter, the amplification factor and offset obtained at this time are set to $G_0$ and $F_0$, respectively. Control goes to the next step. Where at least one of the amplification factor and offset is reset, control returns to step S2.

In step S6, the output at the zero point is subtracted from the output from the A/D converter responding to the intensity of the signal derived from the reference specimen to find the intensity A $(Z_0, V_0, I_0)$ at the amplification factor $G_0$. The amplification factor $G_0$, offset $F_0$, and signal intensity A $(Z_0, V_0, I_0)$ are stored in the storage device 18 shown in FIG. 1.

A procedure for finding the constant term B included in Eq. (1) is next described by referring to the flowchart of FIG. 7. A sequence of operations including operations performed by the operator is controlled by a program loaded in the control-and-calculation unit 16.

Figure 7:
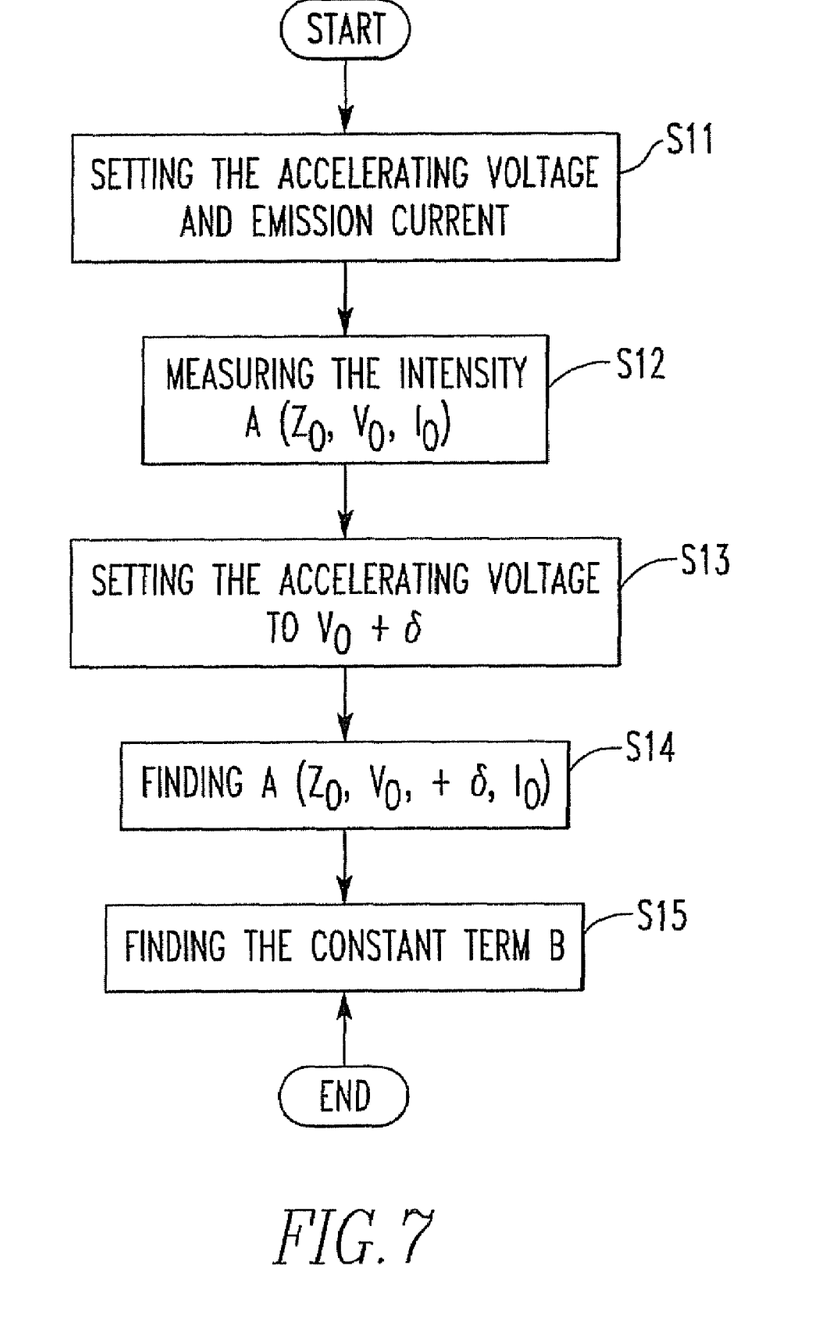
FIG. 7 is a flowchart illustrating a procedure for finding a constant term B.

In step S11, the operator sets the accelerating voltage $V_0$ and the emission current $I_0$.

In step S12, the intensity A $(Z_0, V_0, I_0)$ of the backscattered electron signal derived from the reference specimen is measured by a procedure similar to the procedure illustrated in the flowchart of FIG. 6.

In step S13, the operator sets the accelerating voltage and the emission current to $V_0+\delta$ and $I_0$, respectively. For example, $\delta$ may be set to approximately −5 kV.

In step S14, the output at the zero point is subtracted from the output from the A/D converter indicating the intensity of the signal derived from the reference specimen. A $(Z_0, V_0+\delta, I_0)$ at the amplification factor $G_0$ is found.

In step S15, the constant term B is found from Eq. (3) below. Eq. (3) has been obtained by substituting $V_1=V_0+\delta$ into Eq. (1) and solving the obtained formula about the term B.

$$B = V_0 - \delta \times \frac{A(Z_0, V_0, I_0)}{A(Z_0, V_0 + \delta, I_0) - A(Z_0, V_0, I_0)} \quad (3)$$

The constant term B is stored in the storage device 18 of FIG. 1.

The constant term B is different according to the characteristics of the backscattered electron detector. In addition, if the surface on which backscattered electrons are incident is contaminated, the term may be varied. Therefore, it is desired to perform calibration appropriately by the above-described procedure according to the usage of the system.

Figure 8:
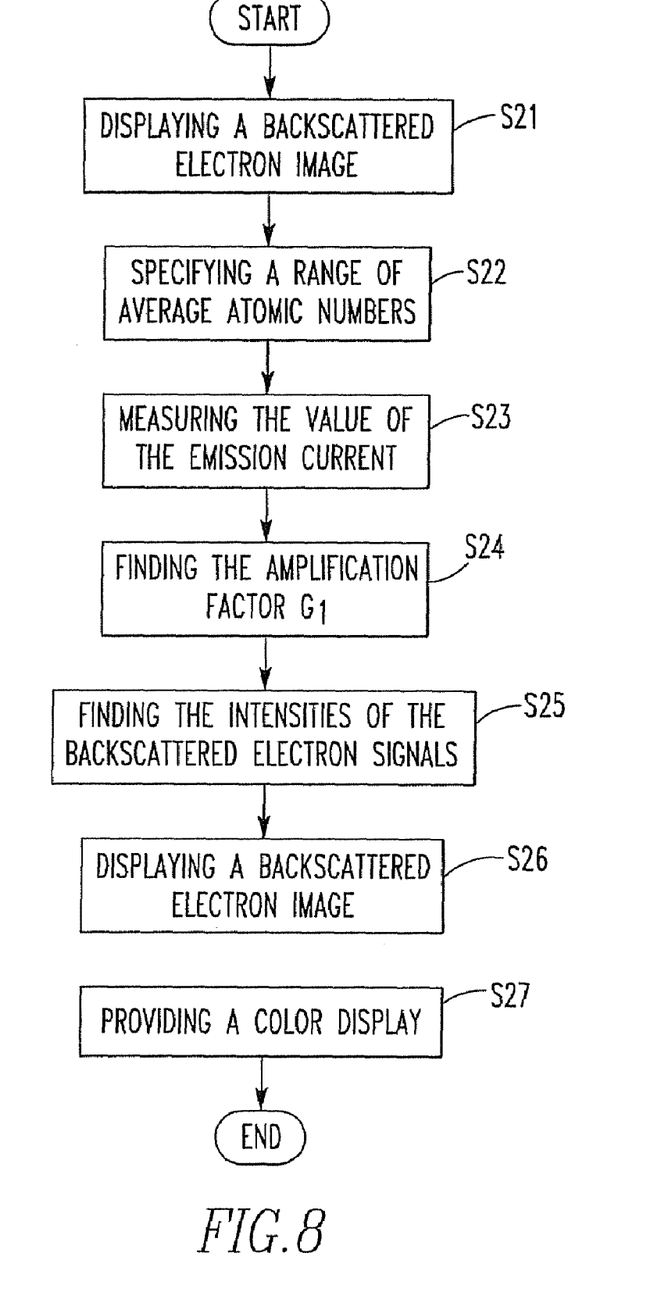
FIG. 8 is a flowchart illustrating a procedure for displaying backscattered electron images at the same brightness and same contrast in cases where the images have been derived from fields of view having the same average atomic number difference but under different illumination conditions.

A procedure for causing backscattered electron images of fields of view having the same average atomic number difference to be displayed at the same brightness and contrast when the illuminating conditions including accelerating voltage and emission current are varied or when a different instrument is used is now described by referring to FIG. 8. A sequence of operations including operations performed by the operator is controlled by a program loaded in the control-and-calculation unit 16.

In step S21, arbitrary illumination conditions including emission current $I_1$ and accelerating voltage $V_1$ are set. A backscattered electron image of a field of view that the operator wants to observe is displayed.

In step S22, a range of average atomic numbers Z to be displayed is specified in terms of its upper limit $Z_U$ and lower limit $Z_L$.

In step S23, the value of the emission current $I_1$ is measured using the emission current detector 5 of FIG. 1.

In step S24, the amplification factor $G_1$ for making a correction for the difference between the signal intensities produced respectively under the illumination conditions (including emission current $I_1$ and accelerating voltage $V_1$) in which the backscattered electron image is being displayed and under the reference illumination conditions including the emission current $I_0$ and accelerating voltage $V_0$ is found using Eq. (2) above.

In step S25, the intensities A $(Z_U, V_0, I_0)$ and A $(Z_L, V_0, I_0)$ of the backscattered electron signals corresponding to the average atomic numbers $Z_U$ and $Z_L$, respectively, are found.

Figure 12:
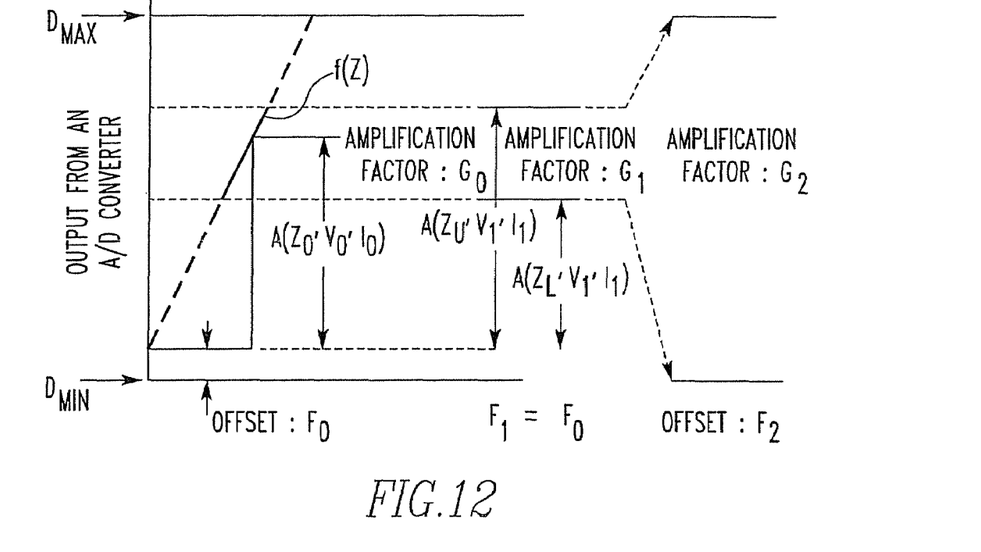
FIG. 12 is a conceptual diagram illustrating the relationship between amplification factor and the output from an A/D converter.

In step S26, an amplification factor $G_2$ and an offset $F_2$ at which the intensities A $(Z_U, V_0, I_0)$ and A $(Z_L, V_0, I_0)$ become equal to $D_{MAX}$ and $D_{MIN}$, respectively, of the output from the A/D converter are found. A backscattered electron image is again displayed. FIG. 12 is a conceptual diagram illustrating the relationship between the amplification factor and the output from the A/D converter. To simplify the illustration, $f(Z)$ is approximated by a linear function. It can be seen from FIG. 12 that an amount $\Delta F_2$ by which the offset $F_1$ needs to be varied to set the amplification factor $G_2$ and offset $F_2$ to 0 is found from Eqs. (4) and (5).

$$G_2 = G_1 \times \frac{D_{\text{Max}} - D_{\text{Min}}}{A(Z_U, V_1, I_1) - A(Z_L, V_1, I_1)} \quad (4)$$

$$\Delta F_2 = -F_1 - \frac{G_2}{G_1} \times A(Z_L, V_1, I_1) \quad (5)$$

In step S27, imaging or photography is performed according to the purpose. Average atomic numbers may be divided into appropriate levels, different colors may be assigned to the levels, and a color display may be provided.

As described so far, backscattered electron images can be displayed at the same brightness and contrast at all times if atomic number differences are the same in cases (i) where the illumination conditions including accelerating voltage and emission current are varied, (ii) the specimen is imaged with a different instrument, or (iii) both conditions (i) and (ii) take place at the same time by adjusting the amplification factor of the amplifier for amplifying the backscattered electron signal based on the average atomic number of the specimen.

In this way, the present invention provides the electron beam system having a function of acquiring a backscattered electron image by directing the sharply focused electron beam EB at the surface of the specimen 8 and detecting backscattered electrons BE produced from the specimen 8. The electron beam system comprises the accelerating voltage-setting circuit (electron beam controller) 13 for setting the accelerating voltage of the electron beam EB, emission current detector 5 for measuring the value of the emission current of the electron beam EB, image processor 11 for measuring the intensity of the output signal from the amplifier 10 for amplifying the output signal from the backscattered electron detector 7, amplification factor-adjusting circuit 12a for adjusting the amplification factor of the amplifier 10 to vary the contrast of the backscattered electron image by increasing or reducing the intensity of the output signal from the amplifier 10, offset-adjusting circuit 12b for adjusting the offset of the amplifier 10 such that the brightness of the backscattered electron image is varied by increasing or reducing the DC component of the output signal from the amplifier 10, storage device 18 for storing the intensity of the output signal from the amplifier 10, amplification factor, and offset when the intensity of the backscattered electron signal was measured under conditions including at least one of a reference accelerating voltage and a reference emission current and using a reference specimen having a known average atomic number, and calculational unit 16 for finding the amplification factor and offset of the amplifier 10 to make a correction such that the amplifier 10 produces a signal intensity equal to the intensity of the backscattered electron signal derived under conditions including at least one of the reference accelerating voltage and the reference emission current when at least one of accelerating voltage and emission current that has been set deviates from the reference accelerating voltage and/or the reference emission current. When a backscattered electron image is obtained under conditions including at least one of an arbitrary accelerating voltage and an arbitrary emission current, the calculational unit 16 finds amplification factor and offset of the amplifier 10 at which the amplifier produces an output intensity equal to the intensity of the backscattered electron signal produced under conditions including at least one of the reference accelerating voltage and the reference emission current, based on output signal intensity, amplification factor, and offset of the amplifier 10 derived when the intensity of the backscattered electron signal was measured under conditions including at least one of the reference accelerating voltage and the reference emission current. The reference accelerating voltage and the reference emission current are stored in the storage device 18. The amplification factor-adjusting means 12a and the offset-adjusting means 12b adjust the amplification factor and offset of the amplifier 10 such that the found amplification factor and offset are achieved.

At this time, the calculational unit 16 can find the amplification factor and offset of the amplifier 10 at which the amplifier produces an intensity equal to the intensity of the backscattered electron signal produced under the conditions including at least one of the reference accelerating voltage and the reference emission current, assuming that there is a linear relationship between an amount of variation of the intensity of the output signal from the amplifier 10 and an amount of variation of at least one of the accelerating voltage and the emission current.

Furthermore, the electron beam system according to the present invention is equipped with the input device 19 for specifying a desired range of average atomic numbers when a backscattered electron image is acquired under conditions including at least one of an arbitrary accelerating voltage and an arbitrary emission current. The calculational unit 16 finds amplification factor and offset of the amplifier 10 at which intensities of the backscattered electron signal corresponding to the upper and lower limits of average atomic numbers specified by the input device 19 are equal to the upper and lower limits of the intensity of the output signal from the amplifier 10. The amplification factor-adjusting circuit 12a and offset-adjusting circuit 12b can adjust the amplification factor and offset of the amplifier 10 such that the found amplification factor and offset are achieved.

When the amplification factor and offset of the amplifier 10 at which the upper and lower limits of the intensities of the backscattered electron signal corresponding to the range of the average atomic numbers specified by the input device 19 are equal to the upper and lower limits of the intensity of the output signal from the amplifier 10 are found as described above, the calculational unit 16 can find amplification factor and offset of the amplifier at which the upper and lower limits of the intensity of the backscattered electron signal become equal to the upper and lower limits of the intensity of the output signal from the amplifier 10, based on a previously found relational formula about average atomic numbers and the intensity of the output signal from the amplifier 10 and on an intensity of the output signal from the amplifier 10, an amplification factor, and an offset obtained when the intensity of the backscattered electron signal was measured under the conditions including at least one of the reference accelerating voltage and the reference emission current stored in the storage device 18.

A backscattered electron image which is displayed using signal intensities in a range delineated by the upper and lower limits of the intensity of the output signal from the amplifier 10 corresponding to the range of average atomic numbers specified by the input device 19 can be classified into different levels using arbitrary intensities. The backscattered electron image can be displayed on the display unit 17 in real time together with a color bar using plural colors respectively assigned to the different levels.

Having thus described my invention with the detail and particularity required by the Patent Laws, what is desired protected by Letters Patent is set forth in the following claims.

The invention claimed is:

1. An electron beam system having a function of obtaining a backscattered electron image by directing a sharply focused electron beam at a surface of a specimen and detecting backscattered electrons emanating from the specimen, said electron beam system comprising:

accelerating voltage-setting means for setting an accelerating voltage of the electron beam;

emission current-measuring means for measuring an emission current of the electron beam;

signal intensity-measuring means for measuring intensity of an output signal from an amplifier that amplifies an output signal from a backscattered electron detector;

amplification factor-adjusting means for adjusting an amplification factor of the amplifier such that contrast of the backscattered electron image is varied by increasing or reducing intensity of the output signal from the amplifier;

offset-adjusting means for adjusting an offset of the amplifier such that brightness of the backscattered electron image is varied by increasing or reducing a DC component of the output signal from the amplifier;

storage means for storing the intensity of the output signal from the amplifier, amplification factor, and offset when the intensity of a backscattered electron signal was measured under conditions including at least one of a reference accelerating voltage and a reference emission current and using a reference specimen having a known average atomic number; and calculational means for finding an amplification factor and an offset of the amplifier to make a correction such that the amplifier produces a signal intensity equal to the intensity of the backscattered electron signal produced under conditions including at least one of the reference accelerating voltage and the reference emission current when at least one of accelerating voltage and emission current that has been set is varied from the reference accelerating voltage and/or the reference emission current, wherein when the backscattered electron image is obtained under conditions including at least one of an arbitrary accelerating voltage and an arbitrary emission current, the calculational means finds an amplification factor and an offset of the amplifier at which the amplifier produces an intensity equal to the intensity of the backscattered electron signal obtained under the conditions including at least one of the reference accelerating voltage and the reference emission current, based on the intensity of the output signal from the amplifier, amplification factor, and offset obtained when the intensity of the backscattered electron signal was measured under the conditions including at least one of the reference accelerating voltage and the reference emission current stored in the storage means, and wherein the amplification factor-adjusting means and the offset-adjusting means adjust the amplification factor and the offset of the amplifier, respectively, such that the found amplification factor and offset are achieved.

2. An electron beam system as set forth in claim 1, wherein said calculational means finds an amplification factor and an offset of the amplifier at which the amplifier produces an intensity equal to the intensity of the backscattered electron signal obtained under the conditions including at least one of the reference accelerating voltage and the reference emission current on the assumption that there is a linear relationship between an amount of variation of the intensity of the output signal from the amplifier and an amount of variation of at least one of the accelerating voltage and emission current.

3. An electron beam system as set forth in any one of claims 1 and 2, wherein there is further provided specifying means for specifying a desired range of average atomic numbers when a backscattered electron image is obtained under conditions including at least one of an arbitrary accelerating voltage and an arbitrary emission current, said calculational means finds an amplification factor and an offset of the amplifier at which intensities of the backscattered electron signal corresponding to upper and lower limits, respectively, of the range of average atomic numbers specified by the specifying means are equal to the upper and lower limits of the intensity of the output signal from the amplifier, and said amplification factor-adjusting means and the offset-adjusting means adjust the amplification factor and offset of the amplifier such that the found amplification factor and offset are achieved.

4. An electron beam system as set forth in claim 3, wherein when the amplification factor and offset of the amplifier at which the upper and lower limits of the intensity of the backscattered electron signal corresponding to the range of average atomic numbers specified by the specifying means become equal to the upper and lower limits of the intensity of the output signal from the amplifier, said calculational means finds the amplification factor and offset of the amplifier at which the amplifier produces signal intensities equal to the upper and lower limits, based on a previously found relational formula about average atomic numbers and the intensity of the output signal from the amplifier and on an intensity of the output signal from the amplifier, an amplification factor, and an offset obtained when the intensity of the backscattered electron signal was measured under the conditions including at least one of the reference accelerating voltage and the reference emission current stored in the storage means.

5. An electron beam system as set forth in claim 3, wherein a backscattered electron image displayed using signal intensities in a range delineated by the upper and lower limits of the intensity of the output signal from the amplifier which corresponds to the range of average atomic numbers specified by the specifying means is classified into plural levels using arbitrary intensities, and where the backscattered electron image is displayed in real time together with a color bar having colors respectively assigned to the levels of the image.

6. A method of operating an electron beam system having a function of obtaining a backscattered electron image by directing a sharply focused electron beam at a surface of a specimen and detecting backscattered electrons emanating from the specimen, said electron beam system comprising:

accelerating voltage-setting means for setting an accelerating voltage of the electron beam;

emission current-measuring means for measuring an emission current of the electron beam;

signal intensity-measuring means for measuring intensity of an output signal of an amplifier that amplifies an output signal from the backscattered electron detector;

amplification factor-adjusting means for adjusting the amplification factor of the amplifier such that contrast of the backscattered electron image is varied by increasing or reducing the intensity of the output signal from the amplifier;

offset-adjusting means for adjusting the offset of the amplifier such that brightness of the backscattered electron image is varied by increasing or reducing a DC component of the output signal from the amplifier;

storage means for storing the intensity of the output signal from the amplifier, amplification factor, and offset when the intensity of a backscattered electron signal was measured under conditions including at least one of a reference accelerating voltage and a reference emission current and using a reference specimen having a known average atomic number; and calculational means for finding the amplification factor and offset of the amplifier to make a correction such that the amplifier produces a signal intensity equal to the intensity of the backscattered electron signal produced under the conditions including at least one of the reference accelerating voltage and the reference emission current when at least one of accelerating voltage and emission current that has been set is varied from the reference accelerating voltage and/or the reference emission current, wherein when the backscattered electron image is obtained under conditions including at least one of an arbitrary accelerating voltage and an arbitrary emission current, the calculational means finds an amplification factor and an offset of the amplifier at which the amplifier produces an intensity equal to the intensity of the backscattered electron signal obtained under the conditions including at least one of the reference accelerating voltage and the reference emission current, based on the intensity of the output signal from the amplifier, amplification factor, and offset obtained when the intensity of the backscattered electron signal was measured under the conditions including at least one of the reference accelerating voltage and the reference emission current stored in the storage means, and then said amplification factor-adjusting means and the offset-adjusting means adjust the amplification factor and the offset of the amplifier, respectively, such that the found amplification factor and offset are achieved.

7. A method of operating an electron beam system as set forth in claim 6, wherein said calculational means finds an amplification factor and an offset of the amplifier at which the amplifier produces an intensity equal to the intensity of the backscattered electron signal obtained under the conditions including at least one of the reference accelerating voltage and the reference emission current on the assumption that there is a linear relationship between an amount of variation of the intensity of the output signal from the amplifier and an amount of variation of at least one of the accelerating voltage and emission current.

8. A method of operating an electron beam system as set forth in any one of claims 6 and 7, wherein said calculational means finds an amplification factor and an offset of the amplifier at which intensities of the backscattered electron signal corresponding to the specified upper and lower limits, respectively, of average atomic numbers are equal to the upper and lower limits of the intensity of the output signal from the amplifier, and wherein said amplification factor-adjusting means and said offset-adjusting means adjust the amplification factor and offset of the amplifier such that the found amplification factor and offset are achieved.

9. A method of operating an electron beam system as set forth in claim 8, wherein when the amplification factor and offset of the amplifier at which the upper and lower limits of the intensity of the backscattered electron signal corresponding to the specified range of average atomic numbers are equal to the upper and lower limits of the intensity of the output signal from the amplifier, the calculational means finds the amplification factor and offset of the amplifier at which the amplifier produces signal intensities equal to the upper and lower limits, based on a previously found relational formula about average atomic numbers and the intensity of the output signal from the amplifier and on an intensity of the output signal from the amplifier, an amplification factor, and an offset obtained when the intensity of the backscattered electron signal was measured under the conditions including at least one of the reference accelerating voltage and the reference emission current stored in the storage means.

10. A method of operating an electron beam system as set forth in claim 8, wherein a backscattered electron image displayed using signal intensities in a range delineated by the upper and lower limits of the intensity of the output signal from the amplifier which corresponds to the specified range of average atomic numbers is classified into plural levels using arbitrary intensities, and wherein said backscattered electron image is displayed in real time together with a color bar having different colors respectively assigned to the levels of the image.

* * * * *